(12) United States Patent
Chao et al.

(10) Patent No.: US 7,372,135 B2
(45) Date of Patent: May 13, 2008

(54) MULTI-CHIP IMAGE SENSOR MODULE

(75) Inventors: Yeong-Ching Chao, Tainan (TW); An-Hong Liu, Tainan (TW); Yao-Jung Lee, Tainan (TW)

(73) Assignees: ChipMos Technologies (Bermeda) Ltd., Hamilton (BM); ChipMos Technologies Inc., Hsinchu (TW)

( * ) Notice: Subject to any disclaimer, the term of this patent is extended or adjusted under 35 U.S.C. 154(b) by 221 days.

(21) Appl. No.: 11/254,659

(22) Filed: Oct. 21, 2005

(65) Prior Publication Data

US 2006/0087018 A1    Apr. 27, 2006

(30) Foreign Application Priority Data

Oct. 21, 2004    (TW) ............................... 93216782 U

(51) Int. Cl.
*H01L 23/02*    (2006.01)
(52) U.S. Cl. .................. 257/678; 257/704; 257/737; 257/723; 257/E23.001
(58) Field of Classification Search ............. 257/680, 257/666, 678, 777, 778, 723, 730, 633, 684, 257/E23.031, E23.059, E23.18, E23.128, 257/704, 738, 737, 772, 779, E23.001, E23.021
See application file for complete search history.

(56) References Cited

U.S. PATENT DOCUMENTS 7,061,106 B2 *    6/2006    Yang et al. ................. 257/723

2003/0001250 A1 *    1/2003    Chien-Hung et al. ....... 257/684

FOREIGN PATENT DOCUMENTS

| TW | 484237 | 4/2002 |
|---|---|---|
| TW | 542493 | 7/2003 |

\* cited by examiner

*Primary Examiner*—Howard Weiss
*Assistant Examiner*—Hoa B Trinh
(74) *Attorney, Agent, or Firm*—Troxell Law Office, PLLC

(57) ABSTRACT

A multi-chip image sensor module includes a flexible module board, an image sensor chip, a transparent cover, and at least an IC chip. The flexible module board has a first die-attached portion, a second die-attached portion, at least one bent portion, and at least one bonding portion where the bent portion connects the first die-attached portion and the bonding portion. The image sensor chip is attached to the first die-attached portion and the IC chip is disposed on the second die-attached portion. Inner leads on the bonding portion are electrically connected to the bonding pads of the image sensor chip when the bonding portion is bonded on the image sensor chip. The transparent cover is disposed above the sensing area of the image sensor chip, preferably adhered to the bonding portion.

10 Claims, 6 Drawing Sheets

MULTI-CHIP IMAGE SENSOR MODULE

FIELD OF THE INVENTION

The present invention relates to an image sensor device, and more particularly, to a multi-chip image sensor module having at least an IC chip on a flexible module board.

BACKGROUND OF THE INVENTION

Image sensor devices have been widely implemented in everyday lives, such as cellular phones, personal digital assistants (PDA), digital still cameras (DSC), digital video cameras (DV), video phones, video conferences, and so on. A conventional image sensor package, as revealed in R.O.C. Taiwan patent publication No. 542,493, entitled "Image sensor structure", comprises a substrate, a protrusion layer, an image sensor chip, and a light-transmission layer (glass cover). The image sensor chip is disposed in the chip cavity formed by the substrate and the protrusion layer. A plurality of signal input terminals are formed on the upper surface of the protrusion layer to provide electrical connections to the image sensor chip by a plurality of bonding wires. Then, through the circuits on the sidewalls of the protrusion layer and on the sidewalls of the substrate, the electrical signals are transmitted to the substrate. An adhesive is partially disposed on the upper surface of the protrusion layer to adhere the light-transmission layer. However, the circuits on the sidewalls of the protrusion layer is easily damaged due to lack of protection. Furthermore, the image sensor package cannot be miniaturized since the bonding wires occupy lots of space in the chip cavity.

Another known image sensor device is revealed in R.O.C. Taiwan patent publication No. 484,237, entitled "An optical device with a tape packaging type". As shown in FIG. 1, an image sensor package includes an image sensor chip 110, a flexible wiring tape 120, a molding base 130, and a transparent cover 140. The flexible module board 120 is TCP type, which has an upper surface 121, a bottom surface 122, and an opening 123. The inner leads of the flexible module board 120 are thermally bonded to the bumps on the image sensor chip 110 by ILB bonding. The molding base 130 has a cavity 131 to accommodate the image sensor chip 110 where a sensing area of the image sensor chip 110 is corresponding to the opening 123 of the flexible wiring tape 120 and outlet of the cavity 131. In order to avoid the image sensor chip 110 from the damages of moisture or dusts, the transparent cover 140 is adhered to the sidewall 132 of the base 130. However, the molding base 130 is made by molding, its thickness is much greater than the thickness of the flexible wiring tape 120. Therefore, the total thickness of the tape automated bonding package of optical devices cannot be reduced. Moreover, no electronic component or passive components are installed in the conventional packages.

SUMMARY OF THE INVENTION

The main purpose of the present invention is to provide a multi-chip image sensor module including a flexible module board. An image sensor chip and at least an IC chip are assembled on the flexible module board. The flexible module board further has a bent portion at the side of the image sensor chip and a bonding portion above the image sensor chip to electrically connect the image sensor chip by inner leads on the bonding portion. A transparent cover is disposed above the image sensor chip. According, the module thickness is thin and module function is easy to expand.

The second purpose of the present invention is to provide a multi-chip image sensor module with a transparent cover. The transparent cover is adhered to the bonding portion so that the bonding portion is sandwiched between the transparent cover and the image sensor chip. Accordingly, the bonding portion is fixed firmly and a sensing area of the image sensor chip is hermetically sealed by an annular sealant.

According to the present invention, a multi-chip image sensor module mainly includes a flexible module board, an image sensor chip, a transparent cover, and an IC chip. The flexible module board has a first die-attached portion, a second die-attached portion, at least one bent portion, and at least one bonding portion, wherein the bent portion connects the first die-attached portion and the bonding portion, a plurality of inner leads are formed on the bonding portion. The image sensor chip is attached to the first die-attached portion of the flexible module board, and the IC chip is disposed on the second die-attached portion. The image sensor chip has a sensing area with a plurality of bonding pads formed around the sensing area. The bonding portion is bonded on the image sensor chip by bending the bent portion such that the inner leads are electrically connected to the bonding pads. The transparent cover is disposed above the image sensor chip. As a result, the analog and digital circuits of the multi-chip image sensor module can be integrated by the flexible module board.

DETAIL DESCRIPTION OF THE INVENTION

Please refer to the attached drawings, the present invention will be described by means of embodiment(s) below.

Figure 1:
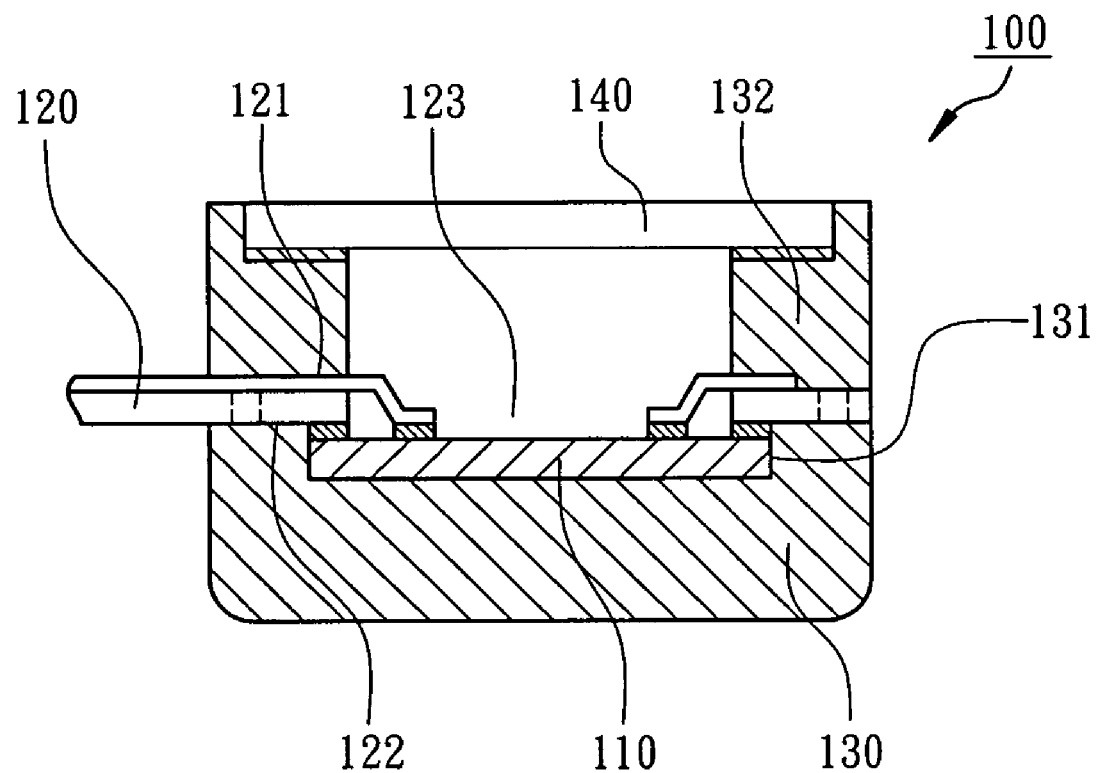
FIG. 1 is a cross-sectional view of a conventional image sensor package.
Figure 2:
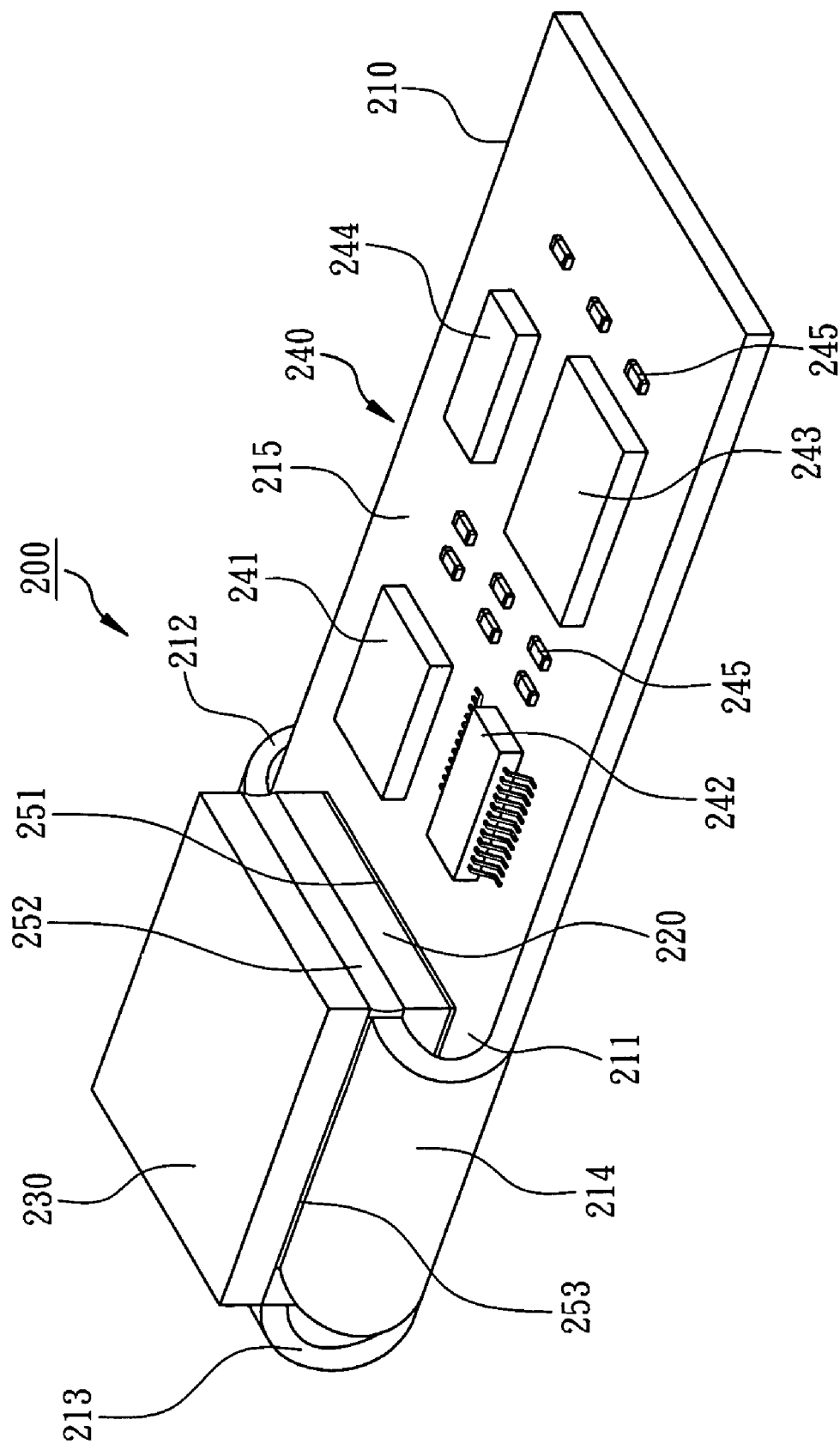
FIG. 2 is a three-dimensional view of a multi-chip image sensor module according to the first embodiment of the present invention.
Figure 3:
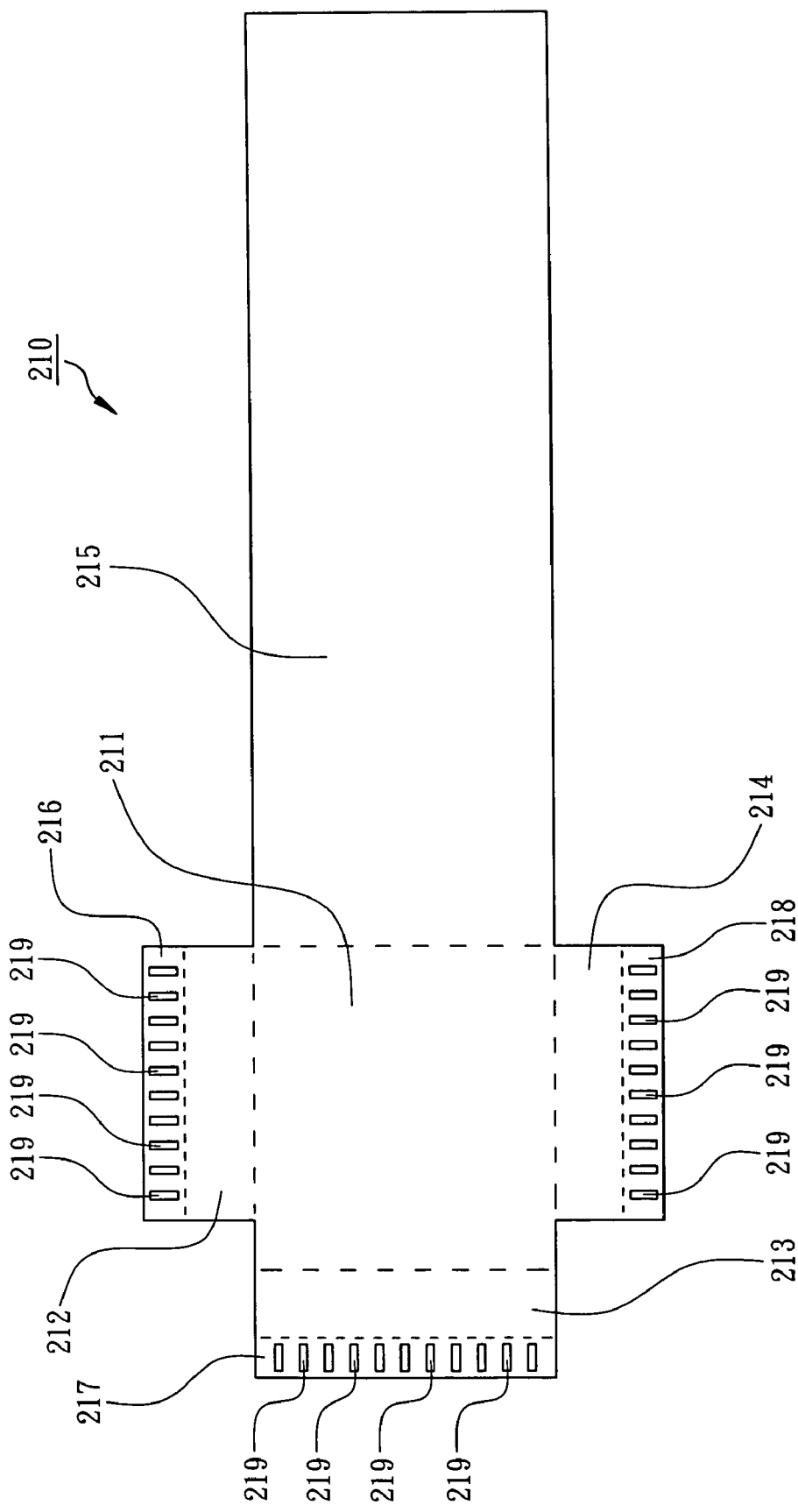
FIG. 3 is a top view of a flexible module board of the multi-chip image sensor module before assembly according to the first embodiment of the present invention.
Figure 4:
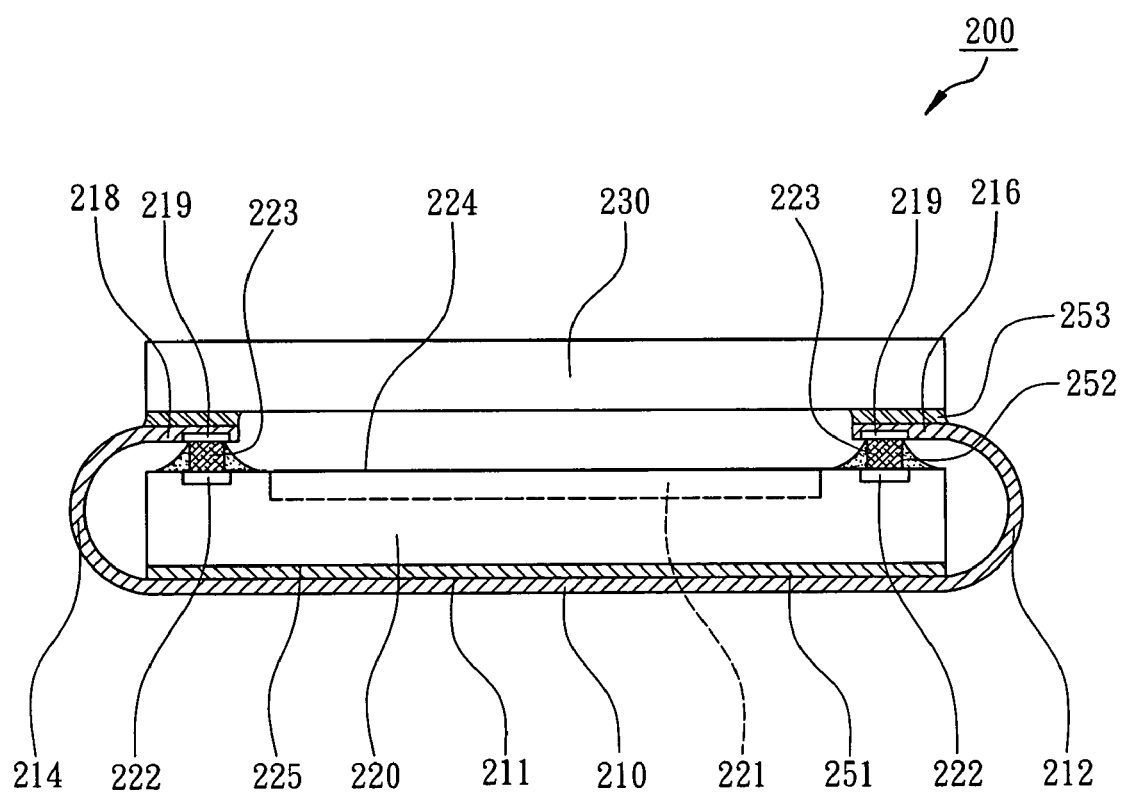
FIG. 4 is a cross-sectional view of the multi-chip image sensor module according to the first embodiment of the present invention.

As shown in FIGS. 2, 3, and 4, a multi-chip image sensor module 200 is disclosed according to the first embodiment of the present invention, which includes a flexible module board 210, an image sensor chip 220, a transparent cover 230, and a plurality of IC chips 240.

Referring FIG. 3, the flexible module board 210 has a first die-attached portion 211, a first bent portion 212, a second bent portion 213, a third bent portion 214, and a second die-attached portion 215. In this embodiment, the first die-attached portion 211 of the flexible module board 210 is rectangular for attaching the image sensor chip 220 (as shown in FIG. 4). One of the sides of the first die-attached portion 211 is integrally connected to the second die-attached portion 215. The other sides are integrally connected to the first bent portion 212, the second bent portion 213, the third bent portion 214 respectively. In addition, the first bent portion 212 is flexible and connects a first bonding portion 216, the second bent portion 213 connects a second bonding portion 217, the third bent portion 214 connects a third bonding portion 218. A plurality of inner leads 219 are formed on the first bonding portion 216, on the second bonding portion 217, and on the third bonding portion 218. The inner leads 219 are electrically connected to an analog and digital circuit (not shown in the figure) formed on the second die-attached portion 215 by traces passing through the bent portions 212, 213, 214 and the first die-attached portion 211.

Referring to FIG. 4, the image sensor chip 220 has an active surface 224 and a back surface 225, wherein the active surface 224 includes a sensing area 221 for receiving images, a plurality of bonding pads 222 are formed around the sensing area 221 on the active surface 224. A plurality of bumps 223 may be formed on the plurality of bonding pads 222 for bonding the inner lead 219. The back surface 225 of the image sensor chip 220 is attached to the first die-attached portion 211 of the flexible module board 210 by an adhesive layer 251. By bending the first bent portion 212, the second bent portion 213, and the third bent portion 214 toward the peripheries of the image sensor chip 220, the first bonding portion 216, the second bonding portion 217, and the third bonding portion 218 are located above the active surface 224 of the image sensor chip 220. By thermal compression, the inner leads 219 on the first bonding portion 216, on the second bonding portion 217, and on the third bonding portion 218 can electrically connect the corresponding bumps 223 on the bonding pads 222 of the image sensor chip 220. Usually each of the bent portions 216, 217, 218 has a bent length greater than the thickness of the image sensor chip.

Disposed above the sensing area 221 is the transparent cover 230 such as an optical glass. In this embodiment, the transparent cover 230 is adhered to the first bonding portion 216, the second bonding portion 217, and the third bonding portion 218 of the flexible module board 210 by an adhesive tape 253. Accordingly, the bonding portions 216, 217, and 218 are sandwiched between the image sensor chip 220 and the transparent cover 230 to prevent from displacement.

Preferably, an annular sealant 252 is disposed between peripheries of the active surface 221 of the image sensor chip 220 and the first, second, third bonding portions 212, 213, 214 to hermetically sealing the sensing area 221 and to encapsulate the bumps 223 without covering the sensing area 221 of the image sensor chip 220. The annular sealant 252 is a NCP (Non-Conductive Paste), ACP (Anisotropic Conductive Paste), or a B-stage resin.

Referring to FIG. 2 again, the IC chips 240 are disposed on the second die-attached portion 215 to electrically connect the analog and digital circuit of the flexible module board 210. The IC chips 240 are selected from the group consisting of a controller chip, a DSP (digital signal processor) chip, a memory chip, and an ASIC (Application Specific Integrated Circuit) chip. The controller is used to control the image sensor chip 220 to receive images. Through the DSP and the ASIC, analog image signals are converted into digital image signals which are temporarily stored in the memory chip. In this embodiment, the IC chips 240 include a chip device 241 packaged in CSP (Chip Scale Package), a chip device 242 packaged in TSOP (Thin Small Outline Package), and a chip device 243 packaged in BGA (Ball Grid Array) type, a flip chip 244, and so on. A plurality of passive components 245 also can be mounted on the second die-attached portion 215. The passive components 245 are used to eliminate the noise during transmission or to prevent electrostatic shocks.

In order to synchronize the transmission of analog and digital signals, the IC chips 240 disposed on the second die-attached portion 215 of the flexible module board 210 are electrically connected to the image sensor chip 200 by the inner leads 219. Moreover, the first bent portion 212, the second bent portion 213, and the third bent portion 214 of the flexible module board 210 cover the sides of the image sensor chip 220 to save consumption of encapsulating material and protect the image sensor chip 220 from damages due to assembly or handling. Moreover, the total module thickness of the module 200 is very thin.

Figure 5:
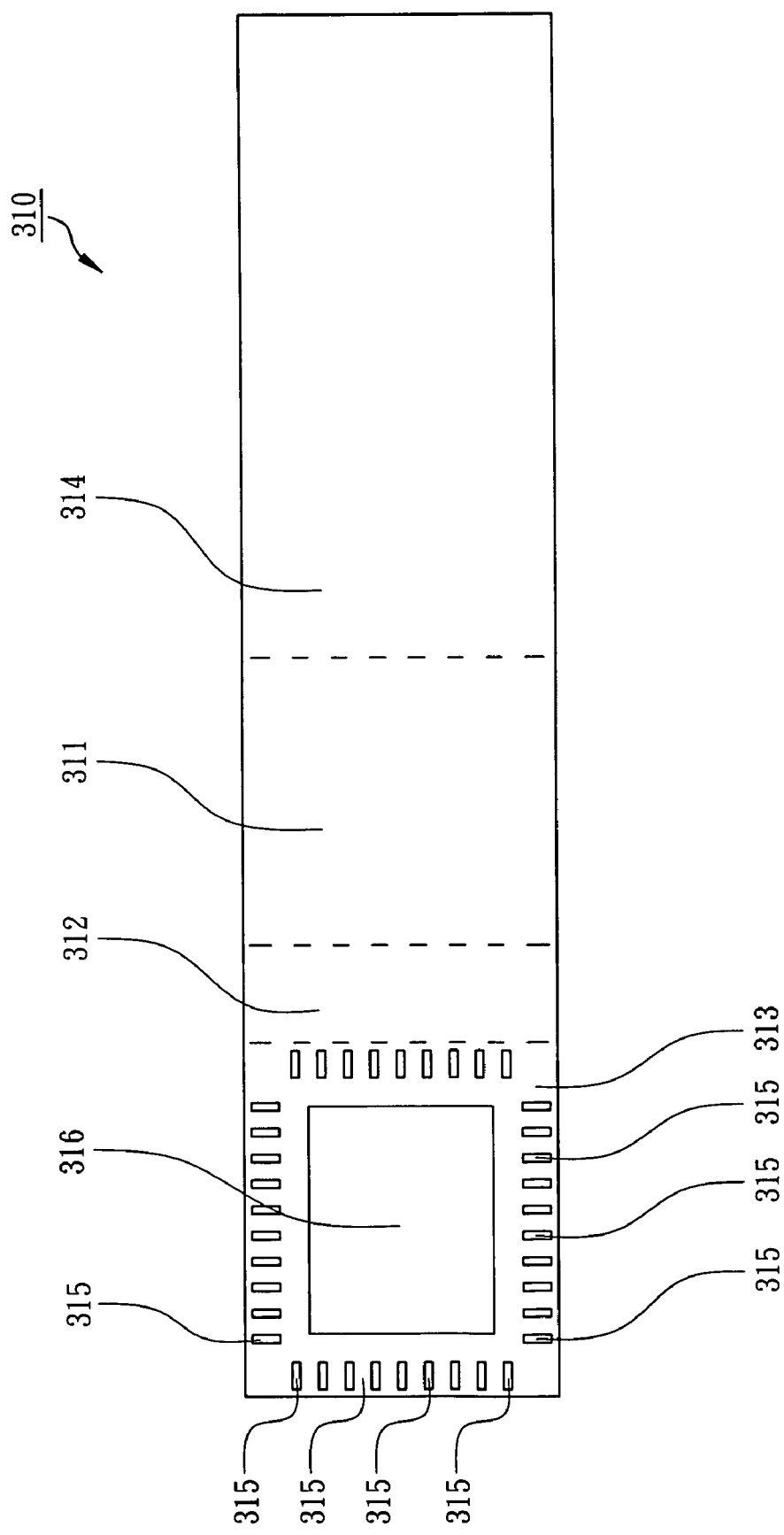
FIG. 5 is a top view of a flexible module board for assembling a multi-chip image sensor module according to the second embodiment of the present invention.
Figure 6:
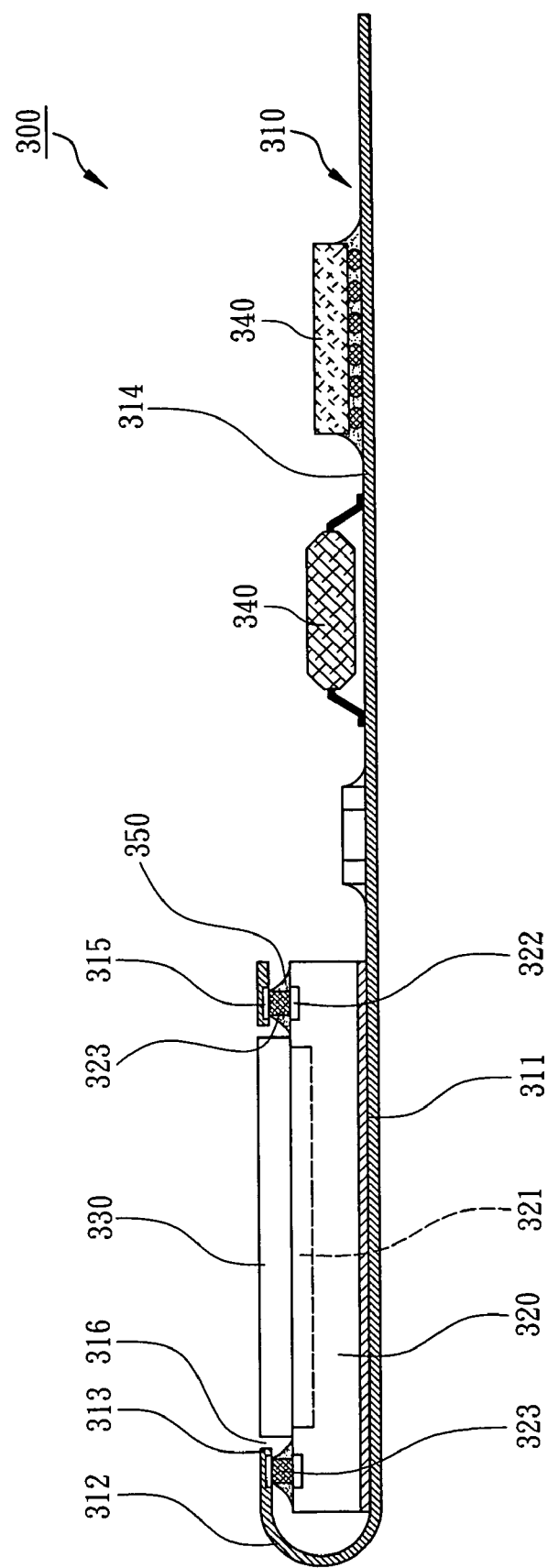
FIG. 6 is a cross-sectional view of the multi-chip image sensor module according to the second embodiment of the present invention.

FIG. 5 shows another flexible module board 310 for assembling a multi-chip image sensor module 300 according to the second embodiment of the present invention. FIG. 6 shows the multi-chip image sensor module 300. As shown FIG. 6, the multi-chip image sensor module 300 mainly includes the flexible module board 310, an image sensor chip 320, and at least an IC chip 340. As shown FIG. 5, the flexible module board 310 has a first die-attached portion 311, a bent portion 312, a bonding portion 313 and a second die-attached portion 314. The bent portion 312 connects the bonding portion 313 to one side of the first die-attached portion 311. The second die-attached portion 314 extends from one of the other sides of the first die-attached portion 311. A plurality of inner leads 315 are formed on the bonding portion 313. In this embodiment, the bonding portion 313 has an opening 316. When the bonding portion 313 is bonded on the image sensor chip 320, the opening 316 is aligned with a sensing area 321 of the image sensor chip 320.

Referring to FIG. 6 again, the image sensor chip 320 is attached to the first die-attached portion 311, the IC chip 240 is disposed on the second die-attached portion 314. A transparent cover 330 is disposed above the sensing area 321 by adhering to peripheries of the active surface of the image sensor chip 320. The image sensor chip 320 includes a plurality of bumps 323 on its bonding pads 322. The inner leads 315 are electrically connected to the bumps 323, so that the image signals from the image sensor chip 320 can be transmitted to an analog and digital circuit formed on the second die-attached portion 314 through the bonding portion 313 and the first die-attached portion 311. Furthermore, image signal can be transmitted to the IC chip 340. Preferably, an adhesive 350 is disposed between the image sensor chip 320 and the bonding portion 313 to prevent the displacement of the bonding portion 313. The IC chip 340 disposed on the second die-attached portion 314 can integrate the analog and digital signals in the image sensor module 300.

The above description of embodiments of this invention is intended to be illustrative and not limiting. Other embodiments of this invention will be obvious to those skilled in the art in view of the above disclosure.

What is claimed is:

1. A multi-chip image sensor module comprising:
   a flexible module board having a first die-attached portion, a second die-attached portion, at least one bent portion, and at least one bonding portion, wherein the bent portion connects the first die-attached portion and the bonding portion, a plurality of inner leads are formed on the bonding portion;
   an image sensor chip having an active surface and a back surface, wherein the active surface includes a sensing area, a plurality bonding pads are formed on the active surface around the sensing area, the back surface is attached to the first die-attached portion, the bonding portion is bonded on the active surface, the bonding pads are electrically connected to the inner leads;
a transparent cover disposed above the sensing area; and
at least an IC chip disposed on the second die-attached portion,
wherein the at least one bent portion is bent to extend around at least one side of the image sensor chip.

2. The module of claim 1, wherein the IC chip is selected from the group consisting of a controller chip, a DSP (digital signal processor) chip, a memory chip, and an ASIC (Application Specific Integrated Circuit) chip.

3. The module of claim 1, further comprising a plurality of passive components mounted on the second die-attached portion.

4. The module of claim 1, wherein the bonding portion has an opening aligned with the sensing area.

5. The module of claim 1, wherein the transparent cover is an optical glass.

6. The module of claim 1, wherein the image sensor chip includes a plurality of bumps formed on the bonding pads.

7. The module of claim 1, further comprising an annular sealant disposed between the bonding portion and the image sensor chip to hermetically sealing the sensing area.

8. The module of claim 1, wherein the bent portion has a bent length greater than the thickness of the image sensor chip.

9. The module of claim 1, wherein the transparent cover is adhered to the bonding portion.

10. The module of claim 1, wherein the inner leads are electrically connected to the second die-attached portion through the bent portion and the first die-attached portion.

* * * * *